United States Patent [19]
Letterman, Jr. et al.

[11] Patent Number: 6,081,031
[45] Date of Patent: Jun. 27, 2000

[54] SEMICONDUCTOR PACKAGE CONSISTING OF MULTIPLE CONDUCTIVE LAYERS

[75] Inventors: James P. Letterman, Jr., Mesa; Albert J. Laninga, Tempe; James H. Knapp, Chandler; Joseph K. Fauty; William F. Burghout, both of Mesa, all of Ariz.

[73] Assignee: Semiconductor Components Industries, LLC, Phoenix, Ariz.

[21] Appl. No.: 09/106,472

[22] Filed: Jun. 29, 1998

[51] Int. Cl.[7] .................. H01C 23/12; H01C 23/495; H01C 23/52
[52] U.S. Cl. .................. 257/730; 257/690; 257/684; 257/692; 257/676; 438/123
[58] Field of Search .................. 257/690, 684, 257/692, 666, 669, 676, 730, 773; 438/123

[56] References Cited

U.S. PATENT DOCUMENTS

| | | | |
|---|---|---|---|
| 4,486,945 | 12/1984 | Aigoo | 29/588 |
| 5,049,977 | 9/1991 | Sako | 357/72 |
| 5,214,307 | 5/1993 | Davis | 257/666 |
| 5,606,199 | 2/1997 | Yoshigai | 257/666 |

OTHER PUBLICATIONS

R. Tummala et al., Microelectronics Packaging Handbook, "Chip–To–Package Interconnections", 1989, pp. 409–435.

*Primary Examiner*—Mahshid Saadat
*Assistant Examiner*—Jesse A. Fenty
*Attorney, Agent, or Firm*—Robert D. Atkins

[57] ABSTRACT

An electronic component includes a substrate (301, 801), a leadframe (101, 601, 710) coupled to a first surface of the substrate (301, 801) and extending beyond the first surface and towards a second surface of the substrate (301, 801), and an electrically conductive layer coupled to the second surface and coplanar with a contact portion of the leadframe (101, 601, 710) where the leadframe (101, 601, 710) and the electrically conductive layer form a package around the substrate (301, 801).

20 Claims, 3 Drawing Sheets

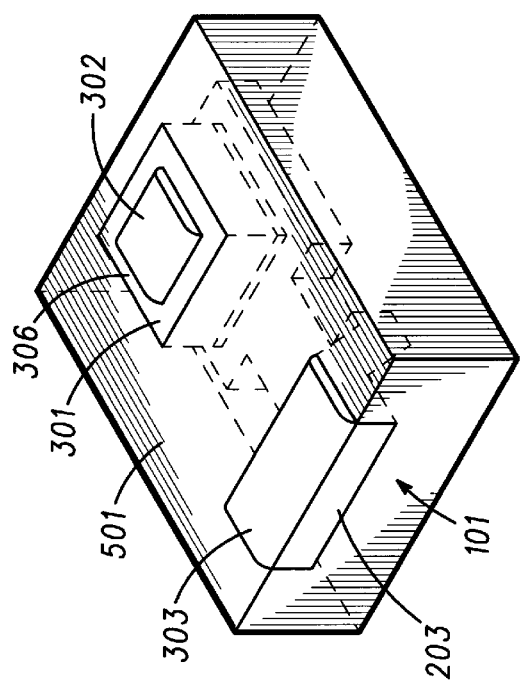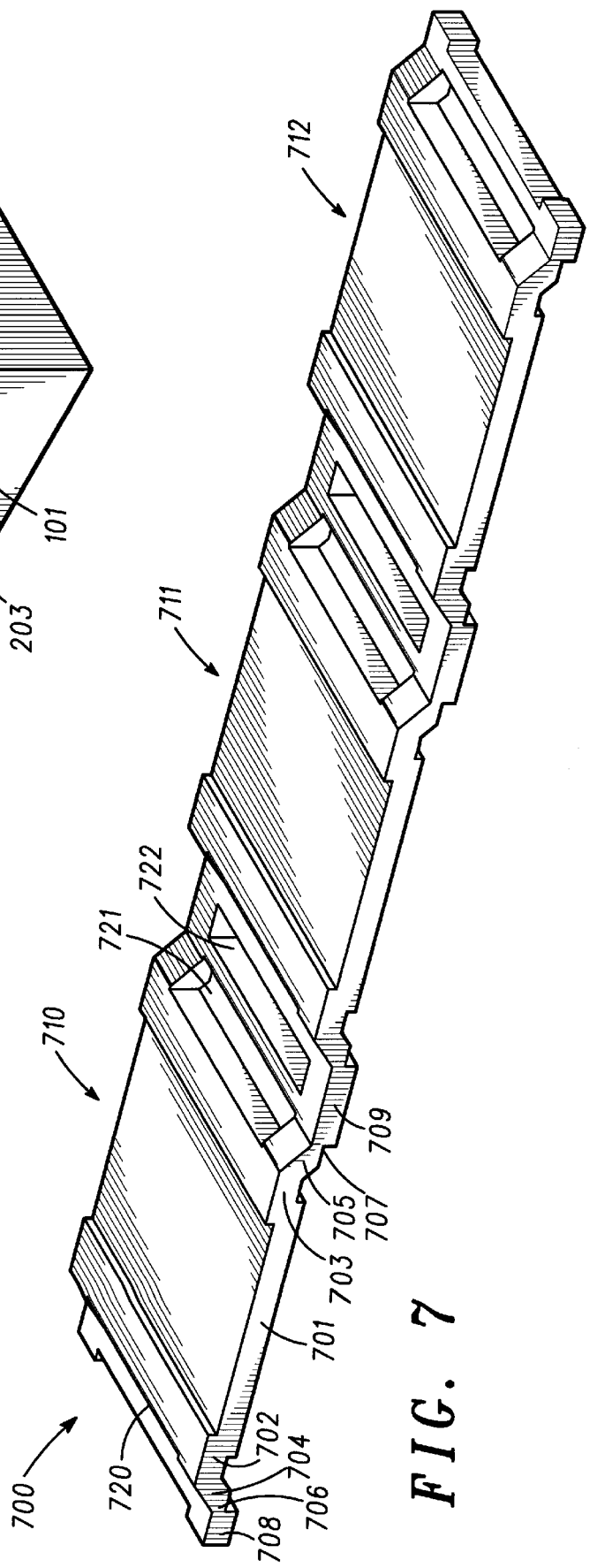

SEMICONDUCTOR PACKAGE CONSISTING OF MULTIPLE CONDUCTIVE LAYERS

BACKGROUND OF THE INVENTION

This invention relates, in general, to electronics, and more particularly, to electronic components and methods of manufacture.

Examples of prior art packages for semiconductor components include, among others, the TO-220, the TO-218, the CASE 77, the TO-247, the TO-3PLB, the D pak, the D2 pak, and the D3 pak. However, the market for semiconductor components constantly demands improvements in the thermal and electrical performance of the components and in the total cost of the components. To achieve these goals, the size of the packaged component should be reduced. Furthermore, reductions should be made in the cost of materials used to manufacture the components and in the cycle time required to manufacture the components. Moreover, the stresses within the components should also be reduced. Prior art packages such as flip chip ball grid arrays reduce some of the stresses, but further improvements should be made to reduce the possibility of cracking the semiconductor die.

Accordingly, a need exists for an electronic component and method of manufacture that has improved thermal and electrical parameters, that is lower in cost, that is smaller in size, and that has lower stress.

BRIEF DESCRIPTION OF THE DRAWINGS

FIG. 5 illustrates an isometric view of another embodiment of the electronic component of FIGS. 3 and 4 in accordance with the present invention;

FIG. 7 illustrates an isometric view of another embodiment of the plurality of leadframes of FIG. 1 in accordance with the present invention;

For simplicity and clarity of illustration, elements in the drawings are not necessarily drawn to scale, and the same reference numerals in different figures denote the same elements.

DETAILED DESCRIPTION OF THE DRAWINGS

Figure 1:
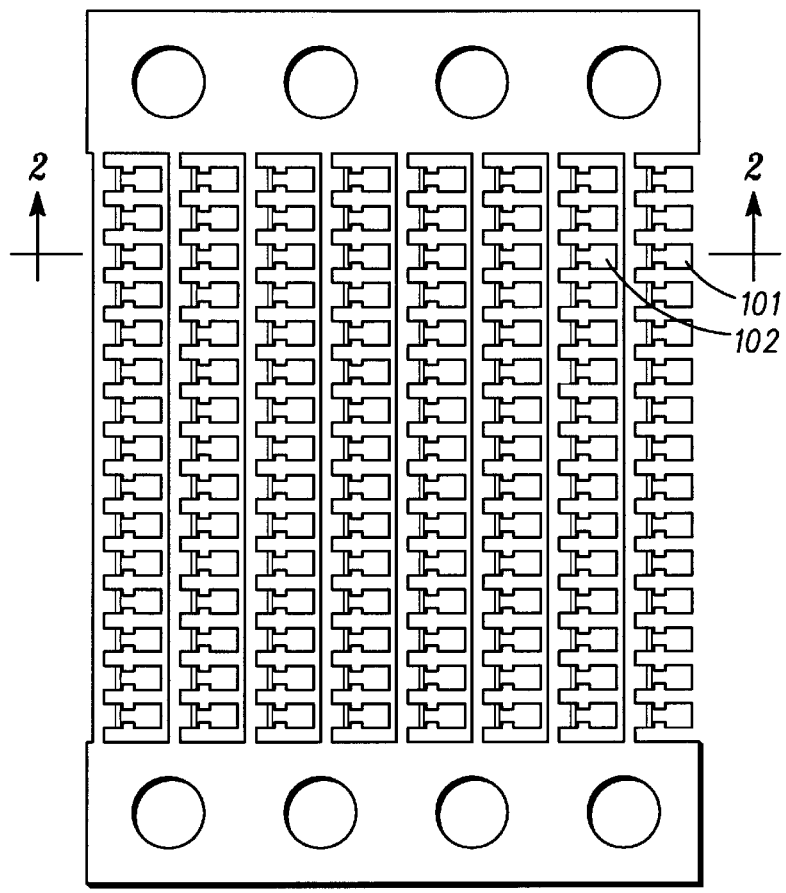
FIG. 1 illustrates a top view of an embodiment of a plurality of leadframes in accordance with the present invention.
Figure 2:
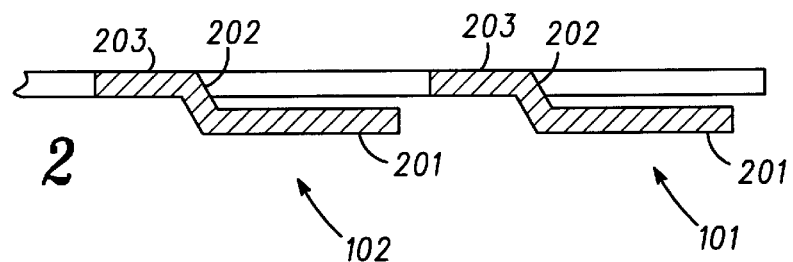
FIG. 2 illustrates a cross-sectional view of a portion of the plurality of leadframes in accordance with the present invention.

FIG. 1 illustrates a top view of an embodiment of a plurality of substantially identical leadframes, which are part of a leadframe strip 100. Two leadframes 101 and 102 of strip 100 are illustrated in a cross-sectional view in FIG. 2. Leadframes 101 and 102 are each comprised of an electrically conductive layer having a die flag or mounting portion 201, an electrical contact portion 203, and an interconnect portion 202 located between and coupling together portions 201 and 203. Portions 201 and 203 are parallel to each other, but are offset or non-coplanar with each other. Portion 202 forms an angle with portions 201 and 203. The angle is preferably about one hundred to one hundred thirty-five degrees in order to permit a plurality of leadframe strips to be stacked on top of one another and to be easily separated from one another. Portion 202 of leadframes 101 and 102 is preferably flexible for reasons explained hereinafter.

To reduce the cost of strip 100, leadframes 101 and 102 can be comprised of an inexpensive electrically conductive material such as, for example, copper. In a preferred embodiment, leadframes 101 and 102 consist solely of copper. As an example, leadframes 101 and 102 can be approximately 0.02 to 1.27 millimeters thick. If the electronic component using leadframe 101 or 102 is a high current or high voltage component, then the leadframe should be thicker than if the component is designed to operate at low currents or low voltages.

Figure 3:
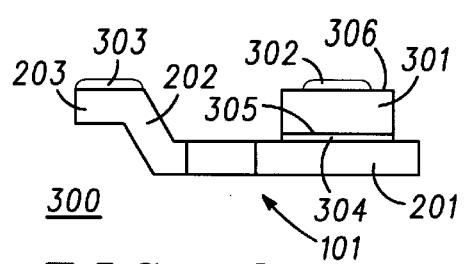
FIG. 3 illustrates a side view of an embodiment of an electronic component in accordance with the present invention.
Figure 4:
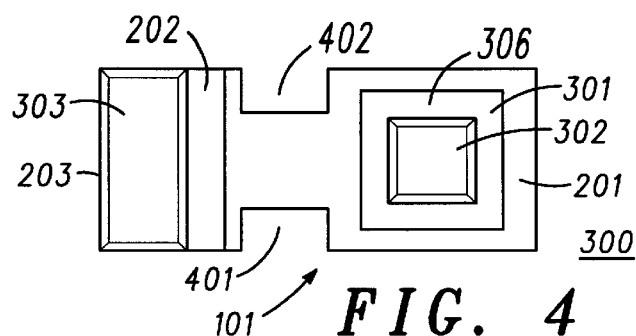
FIG. 4 illustrates a top view of the electronic component of FIG. 3 in accordance with the present invention.

FIG. 3 illustrates a side view of an embodiment of an electronic component 300, and FIG. 4 illustrates a top view of electronic component 300. Component 300 includes leadframe 101 of FIGS. 1 and 2, a device substrate 301, and electrically conductive adhesive layers 302, 303, and 304. Leadframe 101 has been singulated or separated from strip 100 (FIG. 1). As labeled in FIG. 4, leadframe 101 can include optional notches 401 and 402, which are explained in more detailed hereinafter.

Substrate 301 contains an electronic device such as, for example, a semiconductor diode. Substrate 301 can be comprised of a semiconductor material and can also include dielectric and metal layers, depending upon the specific electronic device within or supported by substrate 301. Substrate 301 has a first major surface 305, a second major surface 306 opposite surface 305, and side or edge surfaces coupling together the first and second major surfaces. In component 300, the electronic device within substrate 301 preferably is devoid of or does not extend to the edge surfaces. Therefore, conventional injection mold, transfer mold, or glob top encapsulants are not needed in this embodiment of component 300.

Surface 305 of substrate 301 is mounted over portion 201 of leadframe 101. Electrically conductive adhesive layer 304 is located between substrate 301 and portion 201 of leadframe 101. Layer 304 can be selected from the group consisting of, for example, a solder, an elastomer, an epoxy, a z-axis material, and a eutectic material. As illustrated in FIG. 3, portion 201 is preferably larger than, extends beyond, and completely covers all of surface 305 of substrate 301. This embodiment maximizes the surface area of substrate 301 that is physically and electrically coupled to leadframe 101. The surface area maximization reduces the on resistance of component 300 to improve the electrical performance of component 300. Portions 202 and 203 of leadframe 101 extend beyond the surface 305 of substrate 301 and towards surface 306 of substrate 301 such that portion 203 of leadframe 101 is parallel to and coplanar with surface 306 of substrate 301 in the embodiment illustrated in FIG. 3.

Electrically conductive adhesive layer 302 is coupled to surface 306 of substrate 301, and electrically conductive adhesive layer 303 is coupled to portion 203 of leadframe 101. Layers 302 and 303 are substantially parallel and coplanar with each other. Layers 302 and 303 are physically separated from each other and are not electrically shorted together to permit proper operation of component 300. Layers 302 and 303 and leadframe 101 form a package around substrate 301, which in the preferred embodiment, does not require any additional encapsulants or packaging material. As an example, layers 302 and 303 can be comprised of a solder, an elastomer, an epoxy, a z-axis material, or a eutectic material.

Component 300 is subsequently attached to a circuit board or other assembly. In particular, layers 302 and 303 can be attached or mounted onto a circuit board. Preferably, layers 302 and 303 have a lower melting or reflow temperature compared to that of layer 304. This difference in melting or reflow temperature enables component 300 to be attached to a circuit board without loosening or weakening the adhesive properties of layer 304.

The flexibility of portion 202 of leadframe 101 alleviates the stresses of the assembly. To further reduce the stresses of the assembly, layers 302, 303, and 304 can be comprised of a flexible attachment or adhesive material such as product numbers ME8418, ME8458-92, or ME9650 from AI Technology of Lawrenceville, N.J.

FIG. 5 illustrates an isometric view of an electronic component 500, which is a different embodiment of component 300 in FIGS. 3 and 4. Component 500 is similar to component 300 of FIG. 3, but component 500 includes a packaging material or encapsulant 501 around leadframe 101 and substrate 301. Encapsulant 501 provides better voltage isolation and moisture protection for component 500 compared to component 300 in FIGS. 3 and 4 that does not have an encapsulant. Layers 302 and 303 remain exposed to permit component 500 to be electrically coupled to a circuit board, another electronic component, or the like. Surface 306 of substrate 301 and a portion of portion 203 of leadframe 101 can also remain exposed, as illustrated in FIG. 5. In component 500, notches 401 and 402 (FIG. 4) serve as a mold lock to keep encapsulant 501 in a fixed position relative to the other parts of component 500.

Figure 6:
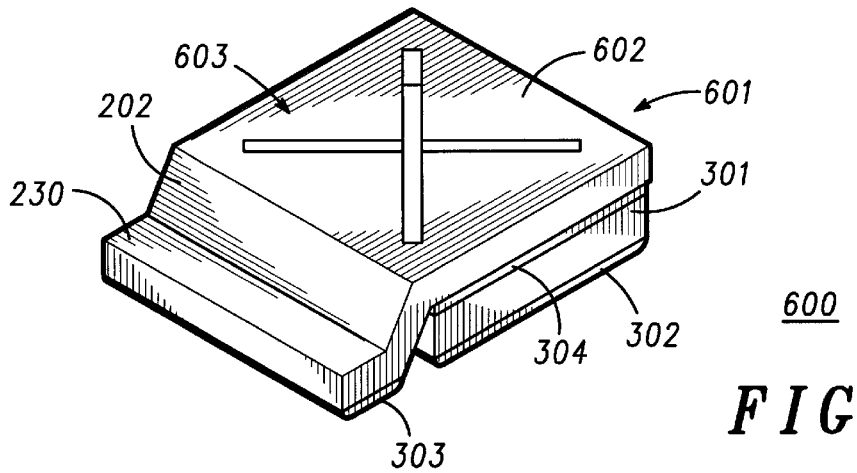
FIG. 6 illustrates an isometric view of yet another embodiment of the electronic component of FIGS. 3 and 4 in accordance with the present invention.

FIG. 6 illustrates an isometric view of an electronic component 600, which is a another embodiment of component 300 in FIGS. 3 and 4. Component 600 includes a leadframe 601, which is similar to leadframe 101 of FIGS. 1, 2, 3, 4, and 5, but leadframe 601 has a die flag or mounting portion 602 that has an aperture or hole 603. Hole 603 extends through all of portion 602 and overlies the first major surface of substrate 301. Hole 603 can either expose a portion of a surface of substrate 301 or a portion of electrically adhesive layer 304 between leadframe 601 and substrate 301. Hole 603 relieves the stresses between leadframe 601 and substrate 301.

FIG. 7 illustrates an isometric view of a plurality of leadframes 710, 711, and 712, which are different embodiments of the plurality of leadframes depicted in FIG. 1. Leadframes 710, 711, and 712 are identical to each other and form a portion of a leadframe strip 700. To reduce the cost of leadframes 710, 711, and 712, the leadframes can be comprised of an inexpensive electrically conductive material such as, for example, copper. Leadframes 710, 711, and 712 preferably consist solely of copper. As an example, leadframes 710, 711, and 712 can each be approximately 0.02 to 1.27 millimeters thick. If the electronic component using leadframe 710, 711, or 712 is a high current or high voltage component, then the leadframe should be thicker than if the component is designed to operate at low currents or low voltages.

Leadframe 710 has a die flag or mounting portion 701 and symmetric portions 702 and 703 adjacent to and located at opposite sides of portion 701. Portions 702 and 703 are substantially symmetric, parallel, and coplanar with each other and are also parallel with portion 701. However, portions 702 and 703 are both offset or non-coplanar with portion 701. Leadframe 710 also includes symmetric portions 704 and 705, which are adjacent to portions 702 and 703, respectively. Portions 704 and 705 form angles of approximately one hundred to one hundred thirty-five degrees with portion 702 and 703 in order to permit a plurality of leadframe strips to be stacked on top of one another and to be easily separated from one another.

Leadframe 710 additionally includes portions 706 and 707, which are adjacent to portions 704 and 705, respectively. Portions 706 and 707 are substantially symmetric, parallel, and coplanar with each other and are substantially parallel with portions 701, 702, and 703. Leadframe 710 further includes contact portions 708 and 709, which are adjacent to portions 706 and 707, respectively. Portions 708 and 709 are substantially symmetric, parallel, and coplanar with each other and are substantially parallel with portions 701, 702, 703, 706, and 707. However, portions 708 and 709 are offset or non-coplanar with portions 706 and 707, respectively. A plane defined by portions 708 and 709 is closer to a plane defined by portion 701 than a plane defined by portions 702 and 703. A plane defined by portion 701 is closer to a plane defined by portions 706 and 707 than a plane defined by portions 708 and 709.

In the embodiment illustrated in FIG. 7, portions 702, 704, and 706 have a hole 720 such that portions 702, 704, and 706 are each comprised of two parallel beams. Similarly, portions 703, 705, and 707 have a hole 721 such that portions 703, 705, and 707 are each comprised of two parallel beams. This configuration of leadframe 710 relieves the stresses between leadframe 710 and a circuit board or other electronic component (not shown) to which leadframe 710 is subsequently mounted. Holes 720 and 721 increase the flexibility of portions 702, 703, 704, 705, 706, and 707 to relieve or alleviate the stresses.

An optional hole 722 in leadframe strip 700 can be located between leadframes 710 and 711. Hole 722 facilitates the separation of leadframe 710 from leadframe 711.

Figure 8:
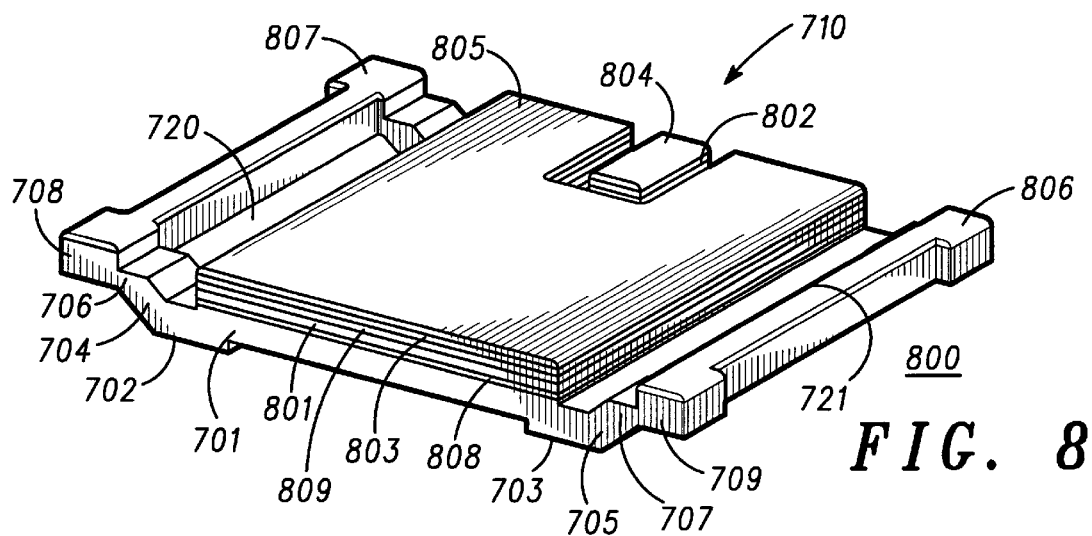
FIG. 8 illustrates an isometric view of another embodiment of an electronic component in accordance with the present invention.

FIG. 8 illustrates an isometric view of an electronic component 800. Component 800 includes leadframe 710 and a device substrate 801. Leadframe 710 has been singulated or separated from strip 700 (FIG. 7). Substrate 801 can be similar to substrate 301 of FIG. 3. Substrate 801 contains an electronic device such as, for example, a vertical metal-oxide-semiconductor field effect transistor. In this embodiment, a drain region is in a first major surface of substrate 801 while source and gate regions are in a second and opposite major surface of substrate 801. The first major surface of substrate 801 is mounted over portion 701 of leadframe 710. An electrically conductive adhesive layer 808 can be located between substrate 801 and portion 701 of leadframe 710. Layer 808 can be similar to layer 304 of component 300 in FIG. 3. Also similar to component 300 in FIG. 3, portion 701 of leadframe 710 in FIG. 8 is preferably larger than, extends beyond, and completely covers all of the first major surface of substrate 801. Portions 702, 703, 704, 705, 706, 707, 708, and 709 also extend beyond the first major surface of substrate 801 in two opposite directions at two opposite edges of substrate 801 and towards the second major surface of substrate 801. Portions 708 and 709 are located at different ones of two opposite edges of the second major surface of substrate 801.

Component 800 also includes electrically conductive layers 802, 803, 804, 805, 806, and 807. Layers 802 and 803 are also heatsinks that preferably consist of the same or similar material as leadframe 710 in order to balance the stresses across substrate 801. Layers 802 and 803 are preferably parallel and coplanar with each other and with portions 708 and 709 of leadframe 710. An electrically conductive adhesive layer 809 can be used between substrate 801 and layers 802 and 803 to attach layers 802 and 803 to substrate 801. Layer 809 can be similar to layer 808.

In addition to being electrically conductive, layers 804, 805, 806, and 807 are preferably also adhesive layers such as, for example, a solder, an elastomer, an epoxy, a z-axis material, or a eutectic material. As an additional example, layers 804, 805, 806, and 807 can be comprised of a flexible attachment material such as product numbers ME8418, ME8458-92, or ME9650 from AI Technology of Lawrenceville, N.J. Layers 804, 805, 806, and 807 preferably have a lower melting or reflow temperature compared to that of layers 808 and 809. This difference in melting or reflow temperature enables component 800 to be attached to a circuit board without loosening or weakening layers 808 and 809. Layers 804, 805, 806, and 807 are substantially parallel and coplanar with each other. Layers 804 and 805 are located over layers 802 and 803, respectively. Layers 806 and 807 are located over portions 708 and 709, respectively, of leadframe 710. In the preferred embodiment, layers 802 and 804 form the gate electrode for component 800; layers 803 and 805 form the source electrode for component 800; and leadframe 710 and layers 806 and 807 form the drain electrode for component 800. Therefore, layers 802 and 804 are preferably physically separated from and not electrically shorted to layers 803, 805, 806, or 807 for proper operation of component 800. Similarly, layers 803 and 805 are preferably physically separated from and not electrically shorted to layers 806 or 807. Layers 802, 803, 804, 805, 806, and 807 and leadframe 710 form a package around substrate 801. A molded encapsulant or other electrically insulative packaging material is not required in component 800 for reasons similar to those explained for component 300 in FIGS. 3 and 4.

The offset between portions 701 and 702 of leadframe 710 and between portions 701 and 703 of leadframe 710 improve the voltage isolation of component 800, especially when an encapsulant is not used for component 800. When layers 806 and 807 are comprised of solder, the offsets between portions 706 and 708 of leadframe 710 and between portions 707 and 709 of leadframe 710 prevent the solder of layers 806 and 807 from wicking down the other portions of leadframe 710 toward substrate 801 to electrically short out component 800.

Figure 9:
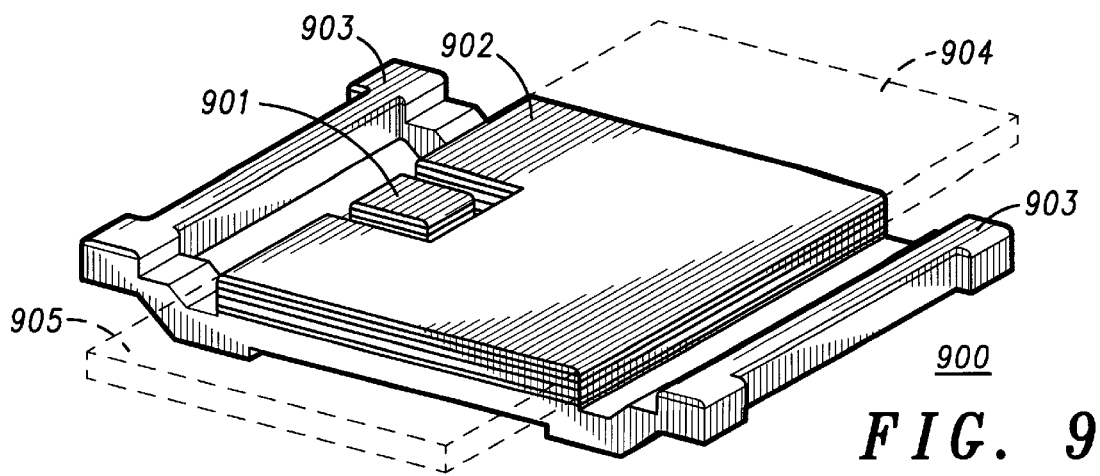
FIG. 9 illustrates an isometric view of an additional embodiment of the electronic component of FIG. 8 in accordance with the present invention.

FIG. 9 illustrates an isometric view of an electronic component 900, which is a different embodiment of component 800 in FIG. 8. Component 900 includes a gate electrode 901, a source electrode 902, and drain electrodes 903. Component 900 is similar to component 800, except that gate electrode 901 of component 900 is rotated about ninety degrees counter-clockwise from that of component 800 in FIG. 8. In both components 800 and 900 of FIGS. 8 and 9, respectively, the source electrode has a notch in which the gate electrode is located. In component 900 of FIG. 9, gate electrode 901 and the notch of source electrode 902 both face towards one of drain electrodes 903. The ninety degree rotation of electrode 901 enables the use of a larger component, as indicated by portions 904 and 905, without having to alter the leadframe strip indexing and other parameters of the manufacturing process. The wider portions 904 and 905 can be accompanied by a wider leadframe.

Therefore, an improved electronic component and method of manufacture is provided to overcome the disadvantages of the prior art. The method produces a surface mount component having a flexible joint and flexible attachment to a circuit board or other assembly. The flexibility provides for stress reduction or relief within the component to compensate for the different coefficients of thermal expansion between the different materials. The flexibility also improves the reliability of the component by reducing the occurrence of other problems such as die cracking and joint fatigue.

The method of manufacture disclosed herein is simpler, less time consuming, and less expensive compared to the prior art. These advantages are accomplished by, among other features, using lower cost piece parts, minimizing material waste, using fewer process steps, and using less machinery, less floor space, and less headcount. For example, the costly scrap from conventional leadframes and conventional packaging processes is eliminated, and the time consuming wire bonding, molding, and leadframe trimming and bending processes are also eliminated. By eliminating the wire bonds and the electrically insulative encapsulant surrounding the device, the packaged size of the component is reduced to chip scale packaging where the final package size is no more than approximately 1.2 times the size of the unpackaged die. The smaller size of the component saves space on a circuit board while providing a larger contact area for an improved thermal path. The larger contact area to the semiconductor substrate reduces the on resistance of the component, which improves the electrical performance of the component.

While the invention has been particularly shown and described mainly with reference to preferred embodiments, it will be understood by those skilled in the art that changes in form and detail may be made without departing from the spirit and scope of the invention. For instance, the numerous details set forth herein such as, for example, the specific configuration of hole 603 in FIG. 6 and the material compositions described herein are provided to facilitate the understanding of the present invention and are not provided to limit the scope of the invention. Furthermore, holes 720, 721, and 722 in FIG. 7 can be different sizes and shapes than those depicted in FIG. 7. For example, hole 720 can be formed only in portion 704 and can be absent from portions 702 and 706. Moreover, a plurality of holes can be formed in portions 702, 704, and 706. For example, two holes can be formed in portions 702, 704, and 706 such that portions 702, 704, and 706 can each be comprised of three beams, instead of the two beams illustrated in FIG. 7. As another variation, holes 720 and 721 in leadframe 710 of FIG. 7 can also be used in component 300 of FIGS. 3 and 4. Furthermore, in order to increase the thermal dissipation efficiency, a heatsink can be attached to the exposed side of portion 201 of leadframe 101 in FIG. 3, to the expose side of portion 602 of leadframe 601 in FIG. 6, and to the exposed side of portion 701 of leadframe 710 in FIGS. 8 and 9. As another variation, component 600 in FIG. 6 can include an additional substrate 301 stacked on top of leadframe 601 and an additional leadframe stacked on top of the additional substrate. The additional leadframe can be similar to leadframe 601 and can be electrically shorted to or electrically isolated from leadframe 601.

Additionally, FIG. 4 illustrates component 300 to have a single contact overlying a substrate, and FIGS. 8 and 9 illustrate components 800 and 900, respectively, each having two contacts overlying a substrate. However, component 800 can have more than two contacts overlying the substrate. As an example, the multiple contacts can form a grid across the entire surface of the substrate or can be located around a perimeter of the substrate. Furthermore, leadframe 101 of FIGS. 1, 2, 3, 4, and 5 or leadframe 601 of FIG. 6 can be substituted for leadframe 710 of FIG. 7, and vice versa. Additionally, component 900 in FIG. 9 can be modified such that the leadframe has four drain contacts, include two additional drain contacts parallel to opposite substrate edge surfaces that are perpendicular to drain contacts 903 depicted in FIG. 9. Moreover, encapsulant 501 in FIG. 5 can also be applied to any of the components and variations disclosed or suggested herein.

Accordingly, the disclosure of the present invention is not intended to be limiting. Instead, the disclosure of the present invention is intended to be illustrative of the scope of the invention, which is set forth in the following claims.

We claim:

1. An electronic component comprising:
   a substrate comprised of semiconductor material and having first and second surfaces opposite each other;
   a first electrically conductive layer, extending beyond the first surface and towards the second surface and having a contact portion extending beyond the first surface, the first surface of the substrate mounted over the first electrically conductive layer; and
   a second electrically conductive layer having one side located over the second surface and an exposed opposite side, the second electrically conductive layer substantially coplanar with the contact portion,
   wherein the first and second electrically conductive layers form a package around the substrate.

2. The electronic component of claim 1 further comprising a semiconductor diode in the substrate wherein the substrate has edge surfaces coupling the first and second surfaces and wherein the semiconductor diode is devoid of extending to the edge surfaces.

3. The electronic component of claim 1 further comprising a semiconductor transistor in the substrate wherein the substrate has edge surfaces coupling the first and second surfaces, wherein the semiconductor transistor is devoid of extending to the edge surfaces, wherein the semiconductor transistor has a drain region at the second surface of the substrate and source and gate regions at the first surface of the substrate, and
   further comprising a third electrically conductive layer coupled to the second surface and substantially coplanar with the contact portion wherein the second and third electrically conductive layers are physically separated from each other.

4. The electronic component of claim 1 wherein the first and second electrically conductive layers are comprised of copper and solder wherein the solder is located over the copper of the contact portion and is substantially coplanar to the solder located over the copper of the second electrically conductive layer.

5. The electronic component of claim 1 wherein the first electrically conductive layer extends beyond the first surface in two opposite directions and towards the second surface at two opposite edges of the second surface, wherein the first electrically conductive layer has a second contact portion, and wherein the contact portion and the second contact portion are at different ones of the two opposite edges of the second surface.

6. The electronic component of claim 1 wherein the first surface of the substrate is mounted over a first portion of the first electrically conductive layer.

7. The electronic component of claim 6 wherein the first portion of the first electrically conductive layer completely covers all of the first surface of the substrate and is larger than the first surface of the substrate.

8. The electronic component of claim 6 wherein the first portion has a hole overlying the first surface of the substrate.

9. The electronic component of claim 6 wherein a second portion of the first electrically conductive layer is located between the first portion and the contact portion and wherein the second portion is substantially parallel to and offset from the first portion wherein a plane defined by the contact portion is closer to a plane defined by the first portion than a plane defined by the second portion, and
   wherein the contact portion is substantially parallel to the first and second portions.

10. The electronic component of claim 6 wherein a second portion of the first electrically conductive layer is located between the first portion and the contact portion and wherein the second portion is substantially parallel to, and offset from the first portion wherein a plane defined by the contact portion is closer to a plane defined by the second portion than a plane defined by the first portion, and
    wherein the contact portion is substantially parallel to the first and second portions.

11. The electronic component of claim 6 wherein a second portion of the first electrically conductive layer is located between the first portion and the contact portion and forms an angle with the first portion that is approximately one hundred to one hundred thirty-five degrees.

12. The electronic component of claim 11 wherein the second portion of the first electrically conductive layer has a hole.

13. The electronic component of claim 12 wherein a third portion of the first electrically conductive layer is located between the first and contact portions and located adjacent to the second portion and wherein the third portion is substantially parallel to and non-coplanar with the first and contact portions, and
    wherein the hole of the second portion extends into the third portion.

14. The electronic component of claim 1 further comprising a flexible electrically conductive adhesive located between the substrate and the first electrically conductive layer.

15. An electronic component comprising:
    a substrate comprised of a semiconductor material and having a first major surface and a second major surface opposite the first major surface;
    a first electrically conductive layer having first, second, third, fourth, and fifth portions, the first major surface of the substrate coupled to the first portion, the second portion coupled to, substantially parallel to, and offset from the first portion, the third portion coupled to and forming an angle of approximately one hundred to one hundred thirty-five degrees with the second portion, the fourth portion coupled to the third portion and substantially parallel to the first and second portions, and the fifth portion coupled to, substantially parallel to, and offset from the fourth portion; and
    a second electrically conductive layer coupled to the second major surface of the substrate and substantially parallel to the fifth portion of the first electrically conductive layer.

16. The electronic component of claim 15 wherein the first electrically conductive layer further comprises sixth, seventh, eighth, and ninth portions, the sixth portion coupled to the first portion, substantially parallel to the first portion, offset from the first portion, located at an opposite side of the first portion from the second portion, and substantially coplanar with the second portion, the seventh portion coupled to and forming an angle of approximately one hundred to one hundred thirty-five degrees with the sixth portion, the eighth portion coupled to the seventh portion, substantially parallel to the first and sixth portions, and substantially coplanar with the fourth portion, and the ninth portion coupled to, substantially parallel to, and offset from the eighth portion, and substantially coplanar with the fifth portion.

17. The electronic component of claim 15 further comprising a third electrically conductive layer coupled to the second major surface of the substrate, physically separated from the second electrically conductive layer, and substantially parallel and coplanar with the second electrically conductive layer and the fifth portion of the first electrically conductive layer.

18. The electronic component of claim 17 wherein the third electrically conductive layer is adjacent to the fifth portion of the first electrically conductive layer.

19. The electronic component of claim 17 wherein the second electrically conductive layer has a notch facing towards the fifth portion of the first electrically conductive layer wherein the third electrically conductive layer is located in the notch.

20. A method of manufacturing an electronic component comprising:

providing a substrate comprised of semiconductor material and having first and second surfaces opposite each other;

mounting the first surface of the substrate over a first electrically conductive layer extending beyond the first surface and towards the second surface, the first electrically conductive layer having a contact portion extending beyond the first surface; and disposing a second electrically conductive layer over the second surface to be substantially coplanar with the contact portion, wherein the first and second electrically conductive layers form a package around the substrate.

* * * * *

UNITED STATES PATENT AND TRADEMARK OFFICE
CERTIFICATE OF CORRECTION

PATENT NO. : 6,081,031
DATED : June 27, 2000
INVENTOR(S) : James P. Letterman Jr. et al.

It is certified that error appears in the above-identified patent and that said Letters Patent is hereby corrected as shown below:

Column 7,
Line 41, change "second" to -- first --.
Line 42, change "first" to -- second --.

Signed and Sealed this

Sixteenth Day of March, 2004

JON W. DUDAS
*Acting Director of the United States Patent and Trademark Office*